(12) United States Patent
Kondo

(10) Patent No.: US 11,396,176 B2
(45) Date of Patent: Jul. 26, 2022

(54) MASK PRINTING MACHINE

(71) Applicant: FUJI CORPORATION, Aichi (JP)

(72) Inventor: Takeshi Kondo, Chiryu (JP)

(73) Assignee: FUJI CORPORATION, Chiryu (JP)

( * ) Notice: Subject to any disclaimer, the term of this patent is extended or adjusted under 35 U.S.C. 154(b) by 0 days.

(21) Appl. No.: 16/978,992

(22) PCT Filed: Mar. 9, 2018

(86) PCT No.: PCT/JP2018/009241
§ 371 (c)(1),
(2) Date: Sep. 8, 2020

(87) PCT Pub. No.: WO2019/171582
PCT Pub. Date: Sep. 12, 2019

(65) Prior Publication Data
US 2020/0406605 A1 Dec. 31, 2020

(51) Int. Cl.
*B41F 15/36* (2006.01)
*B41F 15/08* (2006.01)
*B41F 15/26* (2006.01)

(52) U.S. Cl.
CPC .......... *B41F 15/36* (2013.01); *B41F 15/0818* (2013.01); *B41F 15/26* (2013.01); *B41P 2215/114* (2013.01); *B41P 2215/50* (2013.01)

(58) Field of Classification Search
CPC .. B41F 15/0818; B41F 15/26; B41P 2215/50; B41P 2215/114
See application file for complete search history.

(56) References Cited

U.S. PATENT DOCUMENTS

| 5,176,078 A * | 1/1993 | Homma | B41F 15/12 101/126 |
| 5,740,729 A * | 4/1998 | Hikita | B41F 15/12 101/126 |
| 6,036,994 A | 3/2000 | Tanaka et al. | |
| 6,505,553 B2 * | 1/2003 | Ishida | B41F 15/0818 101/123 |

(Continued)

FOREIGN PATENT DOCUMENTS

JP    2013-18122 A    1/2013

OTHER PUBLICATIONS

International Search Report dated May 15, 2018 in PCT/JP2018/009241 filed Mar. 9, 2018.

*Primary Examiner* — Matthew G Marini
*Assistant Examiner* — Marissa Ferguson-Samreth
(74) *Attorney, Agent, or Firm* — Oblon, McClelland, Maier & Neustadt, L.L.P.

(57) ABSTRACT

In a mask printing machine, a target through hole, which is at least one of multiple through holes formed on the mask, is imaged by an imaging device when the board is below the mask and is at a separated position that is separated from the mask, and when the board is at a contact position in which an upper surface of the board contacts a lower surface of the mask, respectively. Based on a captured image, when the board is at the separated position, and a captured image when the board is at the contact position, it is possible to acquire the movement state of at least one target through hole when the board is lifted from the separated position to the contact position.

9 Claims, 11 Drawing Sheets

(56) References Cited

U.S. PATENT DOCUMENTS

| | | | | |
|---|---|---|---|---|
| 6,568,321 B2* | 5/2003 | Sakamoto | ............... | B41F 15/10 |
| | | | | 101/126 |
| 6,609,458 B2* | 8/2003 | Yamasaki | ............... | B41F 15/26 |
| | | | | 101/126 |
| 9,332,681 B2* | 5/2016 | Mantani | ................... | B23K 1/20 |

* cited by examiner

MASK PRINTING MACHINE

TECHNICAL FIELD

The present disclosure relates to a mask printing machine for printing viscous fluid on a circuit board through a mask.

BACKGROUND ART

In the mask printing machine described in Patent Literature 1, in a state where a circuit board (hereinafter, simply referred to as a board) is positioned in a separated position separated from a mask that is below the mask, a mask mark, which is a recognition mark provided on the mask, and a clamp mark, which is a recognition mark provided on a clamping member that clamps the board from both sides, are imaged by a first imaging section that can enter between the mask and the board, and based on the captured images, a positional correction value at separation, which is a movement amount of the board, is acquired. Further, in a state where the board is in a contact position in which the board is in contact with the mask, the mask mark and the clamp mark are imaged by a second imaging section that can enter above the mask, and based on the captured images, an overlapping state thereof is acquired and a positional correction value at contact, which is the movement amount of the board, is acquired and stored. Thereafter, at the separated position of the board, the board is moved based on the positional correction value at separation that is acquired based on the captured image by the first imaging section and the stored positional correction value at contact, and a position alignment between the board and the mask are performed. As a result, by eliminating the positional deviation between the board and the mask caused by the mechanical error or the like of the board lifting and lowering device for lifting and lowering the board, it is possible to perform the position alignment between the board and the mask with high accuracy.

PATENT LITERATURE

Patent Literature 1: JP-A-2013-18122

BRIEF SUMMARY

Technical Problem

An object of the present disclosure is to acquire a movement state of through holes formed in a mask when a board is lifted from a separated position to a contact position.

Solution to Problem

In a mask printing machine according to the present disclosure, a target through hole, which is at least one of multiple through holes formed on a mask, is imaged by an imaging device when a board is below the mask and is at a separated position that is separated from the mask, and when the board is at a contact position in which an upper surface of the board contacts a lower surface of the mask, respectively. As described above, based on a captured image when the board is at the separated position, and a captured image when the board is at the contact position, it is possible to acquire the movement state of at least one target through hole when the board is lifted from the separated position to the contact position.

DESCRIPTION OF EMBODIMENTS

Hereinafter, a mask printing machine according to an embodiment of the present disclosure will be described in detail based on the drawings.

Embodiment

Figure 1:
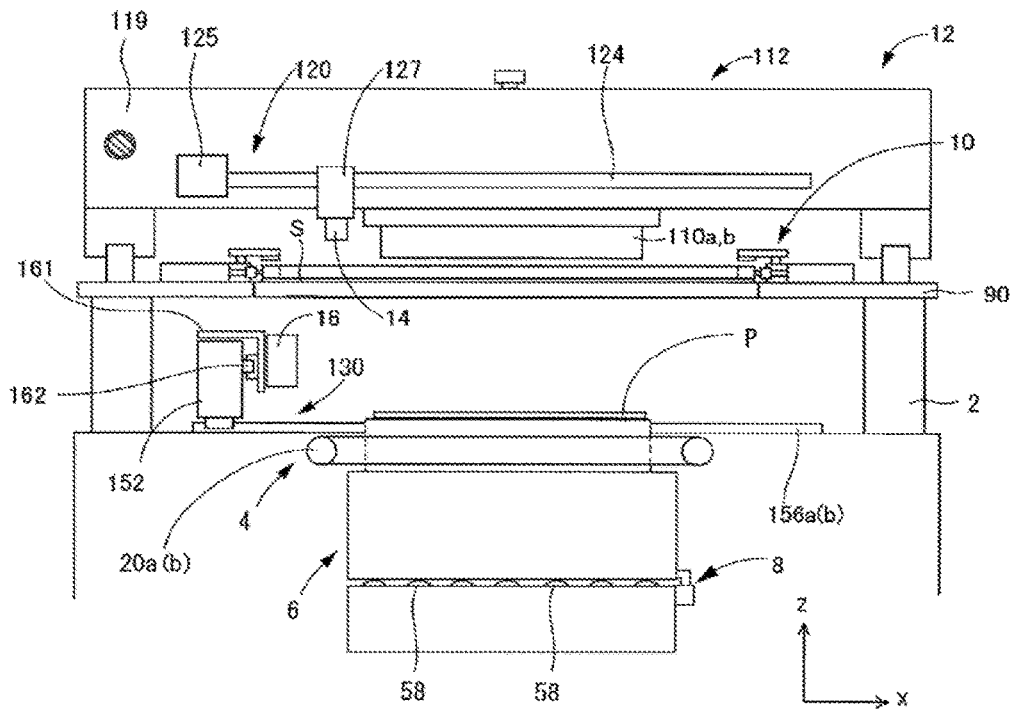
FIG. 1 is a front view of a mask printing machine according to the present disclosure.
Figure 2:
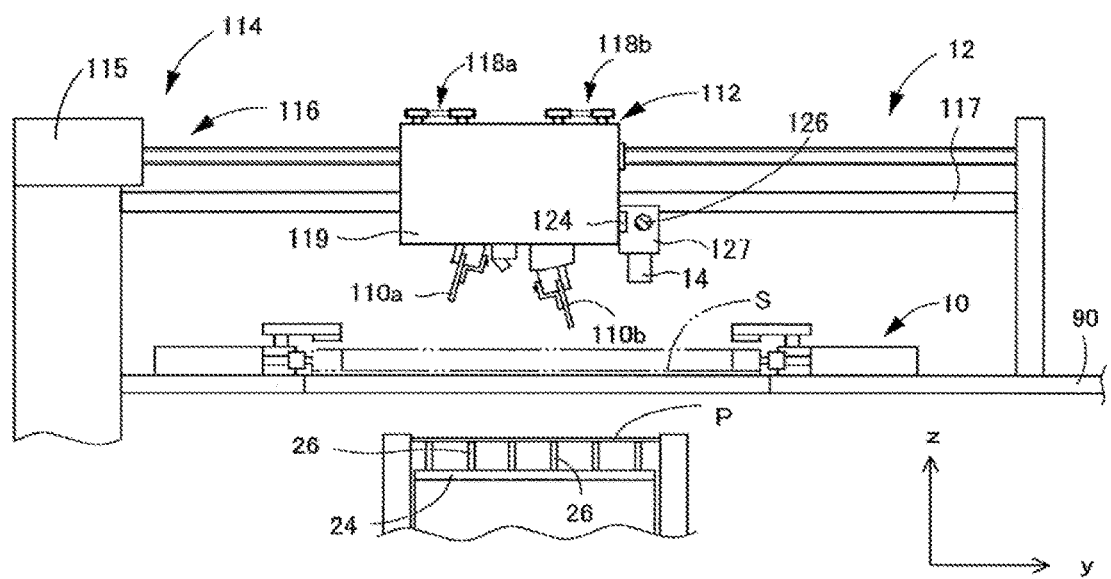
FIG. 2 is a side view of the mask printing machine.
Figure 3:
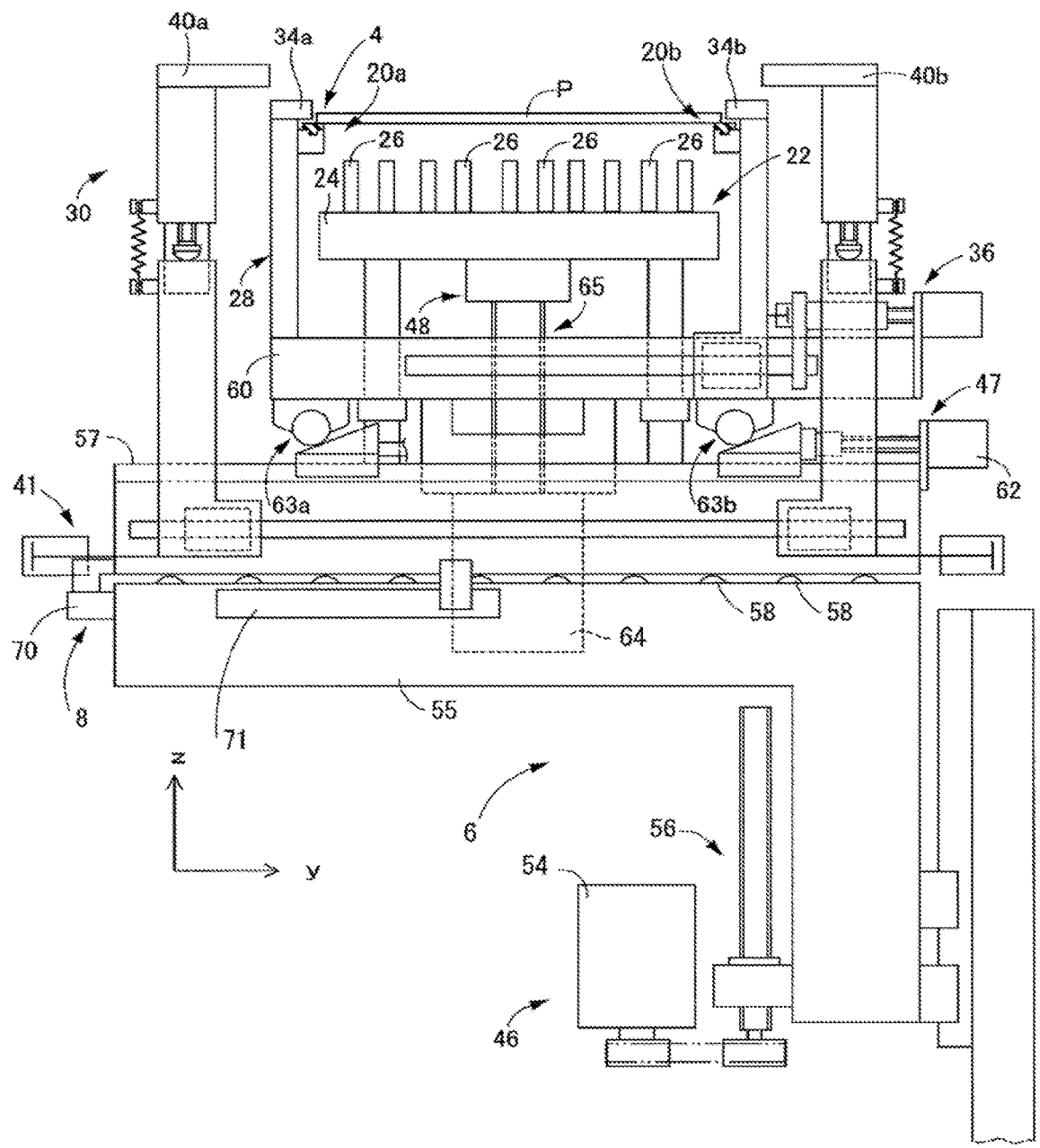
FIG. 3 is a side view illustrating a board holding device of the mask printing machine.

As illustrated in FIGS. 1 to 3, the present mask printing machine is for printing solder paste as viscous fluid through a mask S on a circuit board (hereinafter abbreviated as a board) P, and includes frame 2, board conveyance device 4, board lifting and lowering device 6, board moving device 8, mask device 10, squeegee device 12, first imaging device 14, second imaging device 16, and the like.

Board conveyance device 4 is for conveying board P and includes, for example, a pair of conveyors 20a, 20b, a conveyance motor (not illustrated) for driving pair of conveyors 20a, 20b, and the like. Hereinafter, in the present specification, a conveyance direction of board P is defined as an x direction, a width direction that is the direction orthogonal to the conveyance direction of board P is defined as a y direction, and a thickness direction of board P, that is, a vertical direction of the mask printing machine is defined as a z direction. The x, y, and z directions are orthogonal to each other.

Board lifting and lowering device 6 is for moving (lifting and lowering) board P held by board holding device 22 in the z direction, and board moving device 8 is for moving board P held by board holding device 22 in a xy plane.

Board holding device 22 includes multiple supporting pins 26 attached to supporting plate 24, clamping device 28, board retaining device 30, and the like. Multiple supporting pins 26 are for supporting the board P from the below. Clamping device 28 is for holding board P from both sides in the width direction (y direction), and includes pair of clamping members 34a and 34b, approaching and separating device 36 for moving pair of clamping members 34a and 34b closer to and away from each other, and the like. Board retaining device 30 includes pair of retaining members 40a and 40b, and approaching and separating device 41 for moving pair of retaining members 40a and 40b closer to and away from each other, and the like. The height of the upper surface of board P is defined by contacting the upper surfaces of pair of clamping members 34a and 34b, and the upper surface of board P with the lower surfaces of pair of retaining members 40a and 40b.

Board lifting and lowering device 6 includes first lifting and lowering device 46, second lifting and lowering device 47, third lifting and lowering device 48, and the like. First lifting and lowering device 46 includes electric motor 54, screw mechanism 56 as a motion conversion mechanism that converts the rotation of electric motor 54 into a linear movement in the z direction and transmits the linear movement to the base table 55, and the like; and is a device for lifting and lowering first lifting and lowering table 57 that supports supporting plate 24, clamping device 28, board retaining device 30, and the like together with base table 55. Second lifting and lowering device 47 includes pair of cam mechanisms 63a and 63b and the like, as motion conversion mechanisms that convert the movement of air cylinder 62 and piston rod of air cylinder 62 in the y direction into the movement in the z direction, and transmits the movement to second lifting and lowering table 60; and second lifting and lowering device 47 is for lifting and lowering second lifting and lowering table 60 that supports supporting plate 24 and clamping device 28 with respect to first lifting and lowering table 57. Third lifting and lowering device 48 includes electric motor 64 that is fixed to second lifting and lowering table 60, screw mechanism 65 as a motion conversion mechanism that converts the rotation of electric motor 64 into a linear movement in the z direction and transmits the movement to supporting plate 30, and the like; and is a device for lifting and lowering supporting plate 24 with respect to second lifting and lowering table 60.

Figure 4:
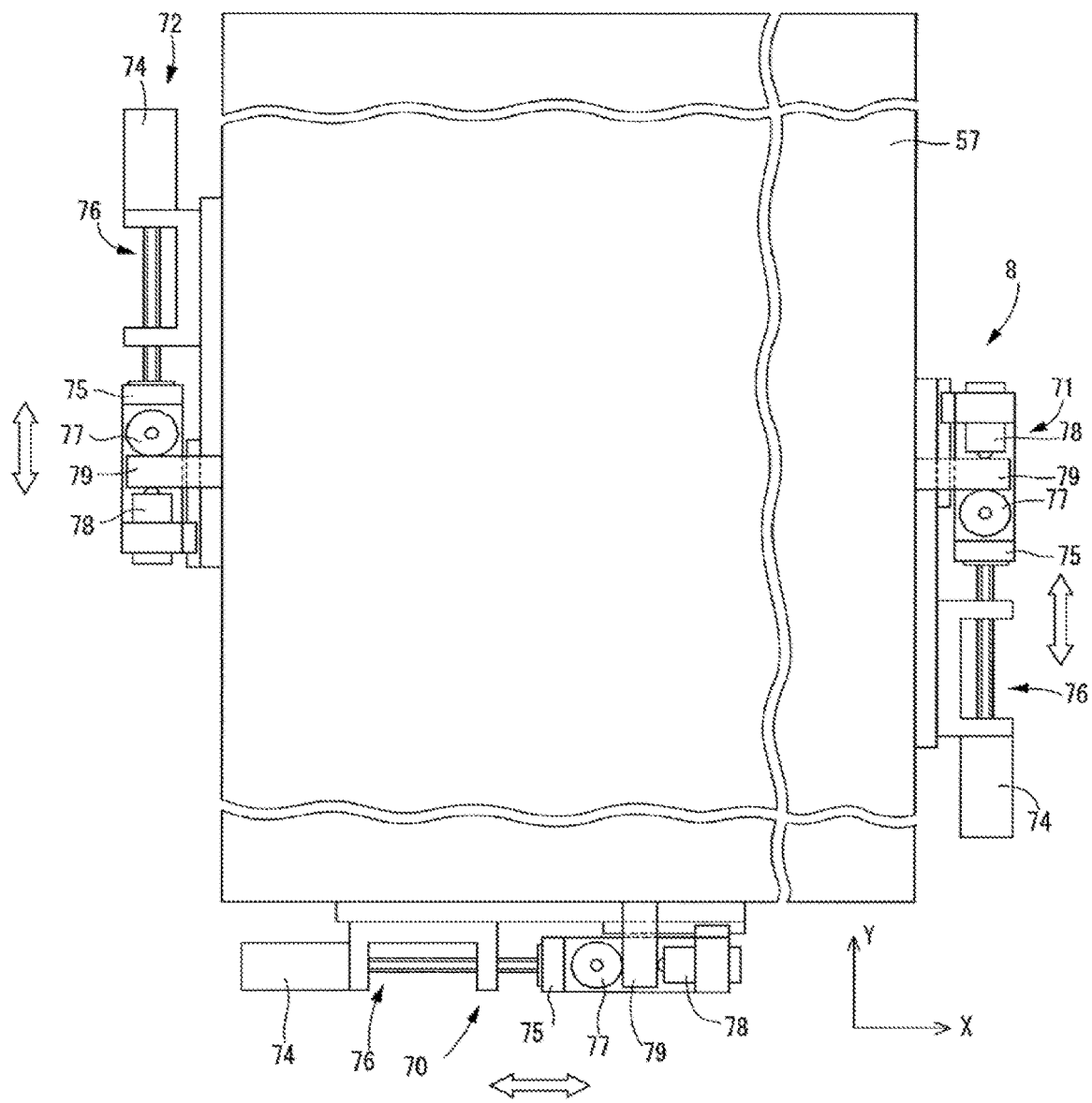
FIG. 4 is a plan view representing a board moving device of the board holding device.

Board moving device 8 is for moving first lifting and lowering table 57 with respect to base table 55 in the xy plane, and includes, as illustrated in FIG. 4, x moving device 70 and two y moving devices 71 and 72. Y moving devices 71 and 72 are provided in a portion facing each other in the x direction of first lifting and lowering table 57. Since x moving device 70 and y moving devices 71 and 72 have the same structure, x moving device 70 will be described as a representative. x moving device 70 includes electric motor 74 mounted on base table 55, moving member 75, screw mechanism 76 as a motion conversion device for converting the rotation of electric motor 74 into a linear movement of moving member 75, and the like; and protruding section 79, which is provided so as to be movable integrally with first lifting and lowering table 57, is engaged with moving member 75 via roller 77 and ball plunger 78. By driving of electric motor 74, moving member 75 is moved in the x direction, and along with this, protruding section 79 and first lifting and lowering table 57 are relatively moved with respect to base table 55 in the x direction. Y moving devices 71 and 72 are operated in different states and x moving device 70 is operated, and thus first lifting and lowering table 57 is rotated around the z axis with respect to base table 55. The relative movement with respect to base table 55 of first lifting and lowering table 57 is allowed to be smooth by multiple steel balls 58 interposed between first lifting and lowering table 57 and base table 55 (see FIG. 3).

Figure 8:
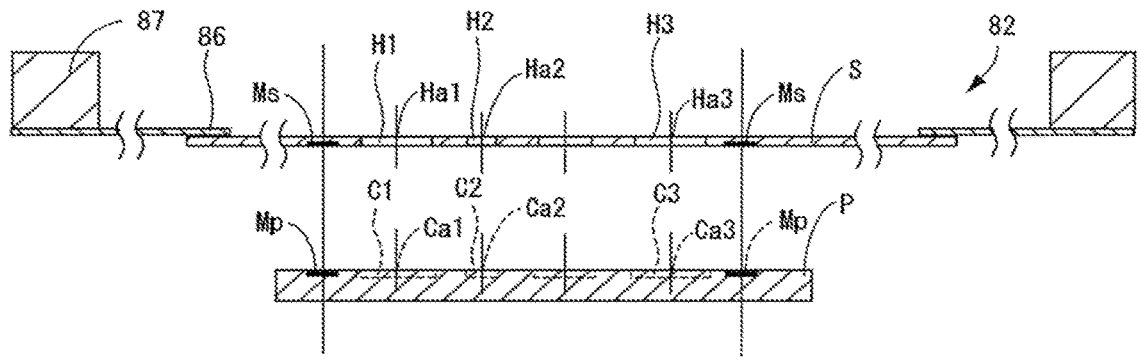
FIG. 8 is a diagram illustrating a state where the board is in a separated position in the mask printing machine.
Figure 9:
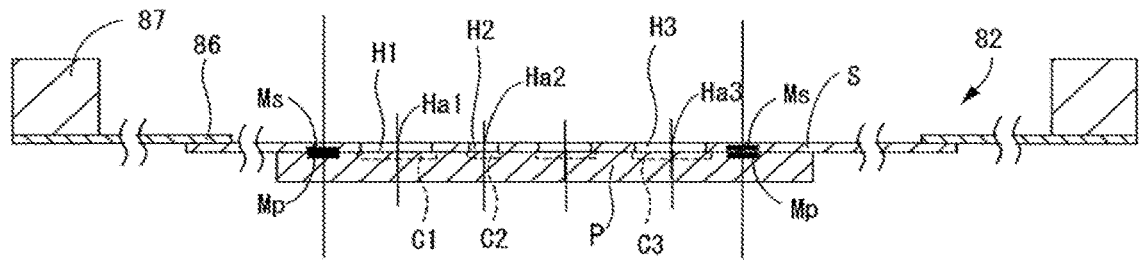
FIG. 9 is a diagram illustrating a state where the board is in a contact position in the mask printing machine.
Figure 10:
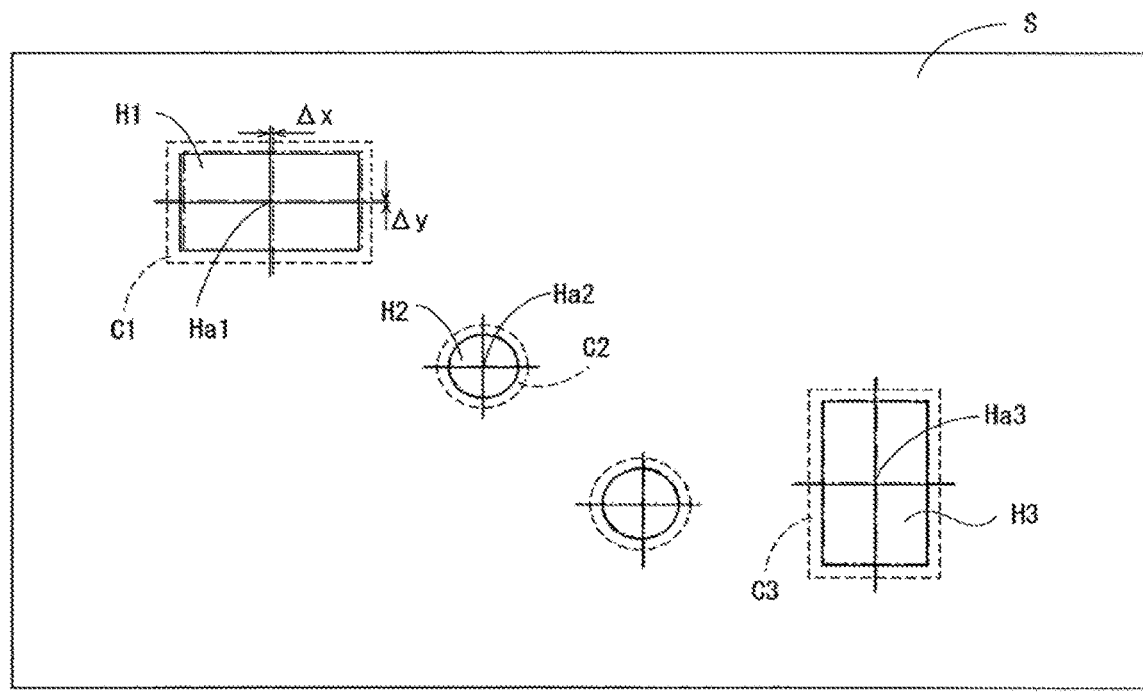
FIG. 10 is a diagram illustrating a movement state of a through hole formed in the mask held in the mask holding device.

Mask device 10 is provided above board lifting and lowering device 6 of the frame 2 or the like, and includes mask holding device 82, mask moving device 83, clamping mechanism 84, and the like. Mask holding device 82 is for holding mask S in a planar-shape in a state where mask S is pulled, and includes mesh 86 and mask frame 87 which has a rectangular form. Mask S is a thin film made of metal and has, as illustrated in FIGS. 8, 10, and the like, multiple through holes H formed in multiple portions corresponding to multiple printing portions C of board P. In FIGS. 8, 10, and the like, printing portions C1, C2, C3, through holes H1, H2, and H3 are described, but hereinafter, when there is no need to distinguish the printing portions and the through holes, it may be referred to as printing portion C and through hole H when referring collectively. The same applies to target through holes H. Further, through hole H and printing portion C described in FIG. 8, 10, or the like are different from the shapes actually formed on mask S and board P. Furthermore, pair of reference marks Ms are formed in a portion of mask S that is diagonally spaced. Pair of reference marks Ms are positioned at portions of mask S corresponding to pair of reference marks Mp formed on board P so as to be diagonally spaced from each other.

Mesh 86 is made of, for example, polyester fibers or the like, and can be made to have stretchability. Mesh 86 is generally frame-shaped and is attached to mask frame 87 at the periphery section with an adhesive. Mask S is attached to mesh 86 with an adhesive at the periphery section in a pulled state.

Figure 5:
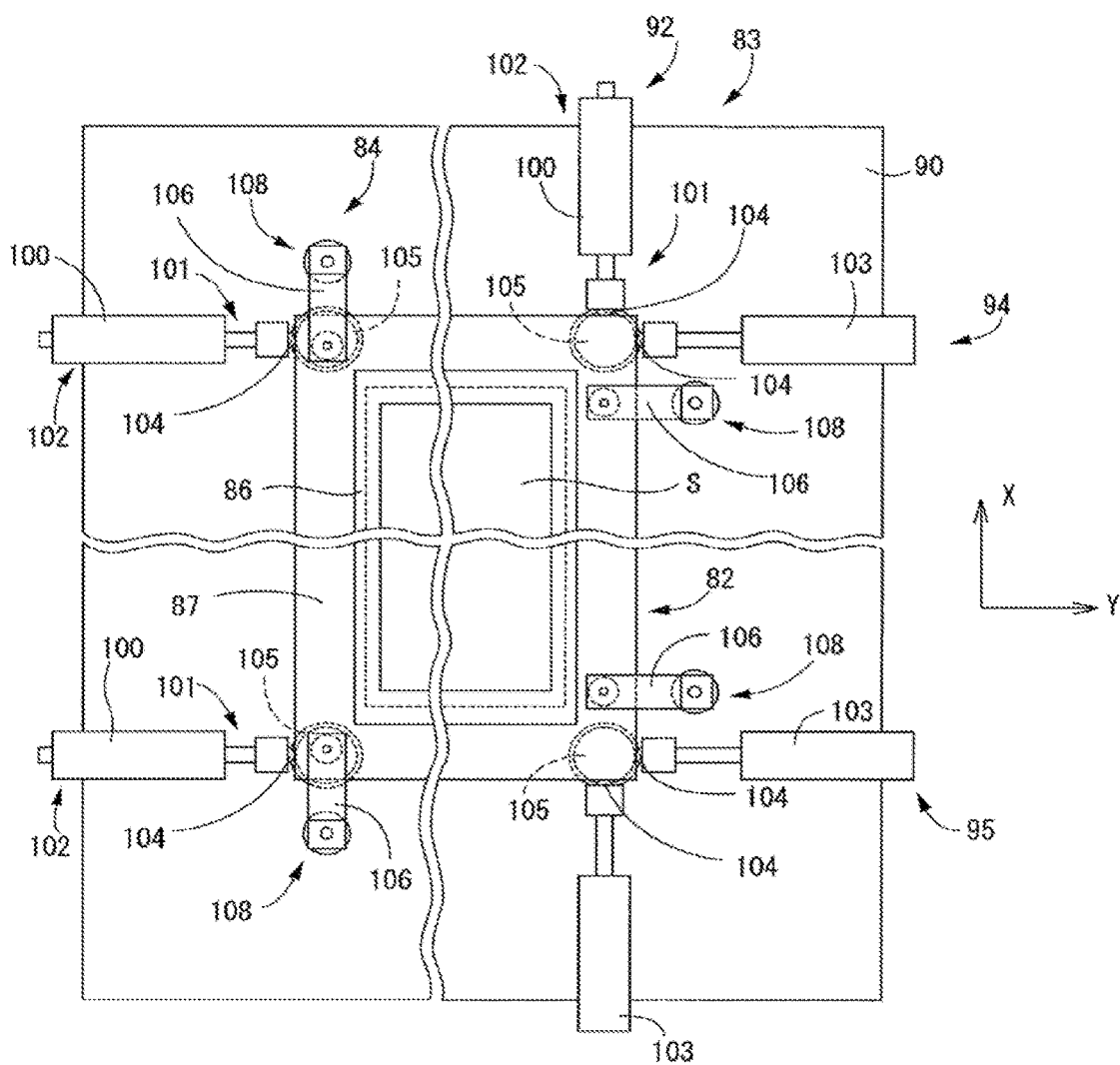
FIG. 5 is a plan view representing a mask moving device of a mask holding device of the mask device.

Mask moving device 83 is for moving mask S by moving mask frame 87 in the xy plane and includes, as illustrated in FIG. 5, x moving device 92 provided on frame holding table 90 for holding mask frame 87, two y moving devices 94 and 95, and the like. Since x moving device 92 and y moving devices 94 and 95 have the same structure, x moving device 92 will be described as a representative. X moving device 92 includes driving device 102 and pressing device 103 provided in portions of mask frame 87 facing each other in the x direction. Driving device 102 includes electric motor 100 and motion conversion mechanism 101 that converts the rotation of electric motor 100 into a linear movement and transmits the movement to mask frame 87. Pressing device 103 is constituted by an air cylinder or the like, and applies a reaction force while allowing the movement of mask frame 87 by driving device 102. Each of driving device 102 and the pressing device 103 is engaged with mask frame 87 via roller 104, and mask frame 87 is held by frame holding section 90 via rotating body 105. Thereby, the movement of mask frame 87 in the xy plane can be smoothly performed. Y moving devices 94 and 95 are operated in different states and x moving device 92 is operated, and thus mask frame 87 is rotated around the z axis.

Clamping mechanism 84 includes four clamping devices 108 which are provided separated from each other. Each of clamping devices 108 includes a cylinder and clamping member 106 integrally and movably engaged with a piston rod of the cylinder, and by the operation of the cylinder, clamping member 106 is moved to the clamping position where mask frame 87 is pressed and the non-clamping position where it is separated from mask frame 87. At the non-clamping position of clamping member 106, x moving device 92 and y moving devices 94 and 95 are operated, and thus mask frame 87 is moved in the xy plane with respect to frame holding table 90, and at the clamping position of clamping member 106, mask frame 87 is held.

As illustrated in FIGS. 1 and 2, squeegee device 12 includes squeegee head 112 having pair of squeegees 110*a* and 110*b*, and squeegee moving device 114 for moving squeegee head 112 in the y direction. Squeegee moving device 114 includes electric motor 115, a slider (not illustrated), screw mechanism 116 as a motion conversion mechanism that converts the rotation of electric motor 115 into a linear movement and transmits the movement to the slider, guide rail 117 that is extended in the y direction, and the like; and squeegee head 112 is fixedly held by the slider. Head main body 119 of squeegee head 112 is provided with lifting and lowering devices 118*a*, 118*b*, and the like for lifting and lowering each of squeegees 110*a* and 110*b*.

First imaging device 14 is a mask through hole imaging device for imaging through hole H formed in mask S from above, and is movable above mask S and along mask S. A first imaging device moving device for moving first imaging device 14 includes x moving device 120 provided in head main body 119. X moving device 120 includes guide rail 124 extended in the x direction, electric motor 125, ball screw 126 to be rotated by electric motor 125, slider 127 having a nut member engaged with ball screw 126, and the like; and first imaging device 14 is integrally movably held by slider 127. First imaging device 14 is moved in the x direction by x moving device 120, and is moved in the y direction by squeegee moving device 114. Therefore, the first imaging device moving device can be considered to be constituted by x moving device 120 and squeegee moving device 114 or the like.

Figure 6:
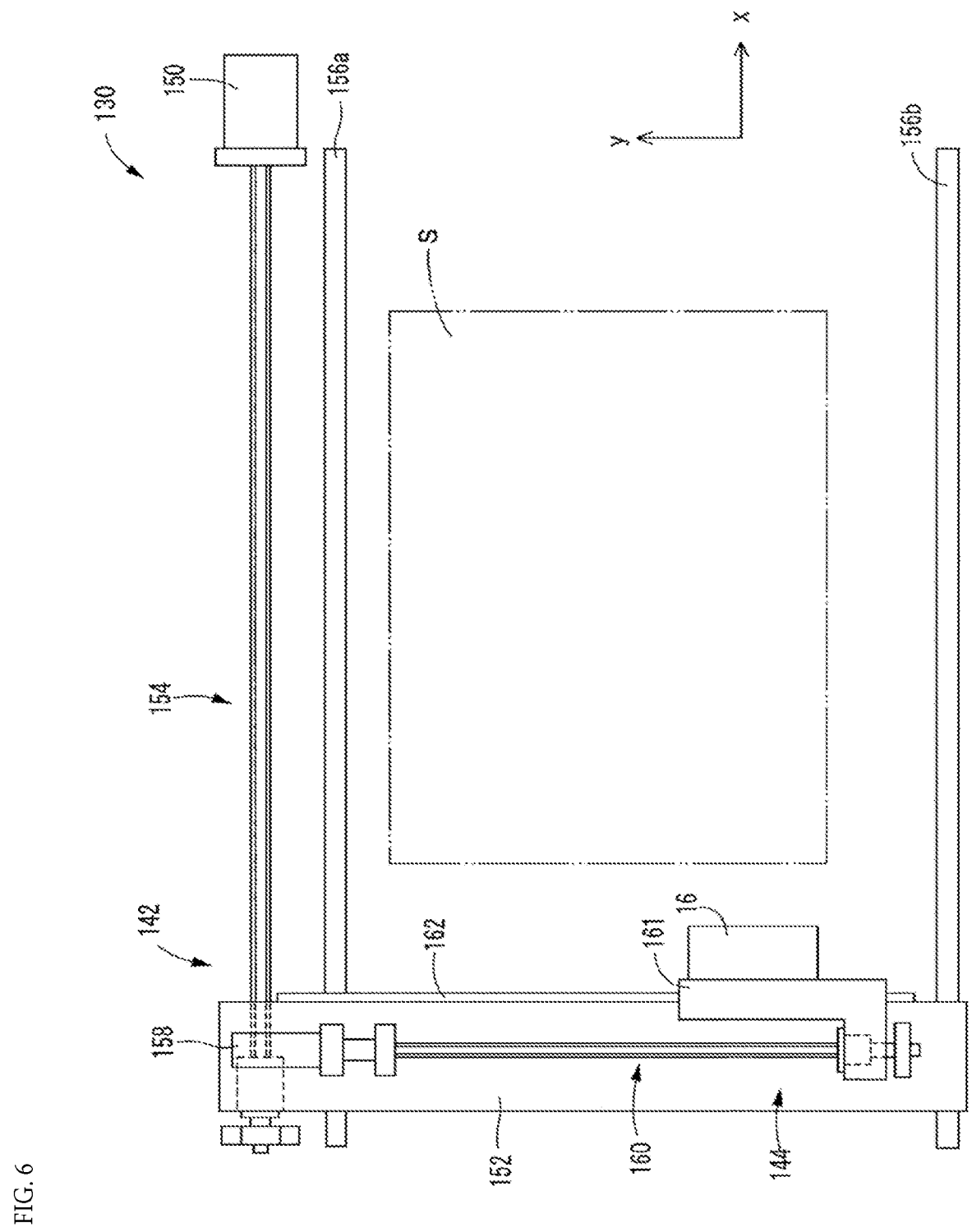
FIG. 6 is a plan view representing a second imaging device of the mask printing machine.

Second imaging device 16 is a reference mark imaging device that captures images of reference marks Mp and Ms provided on board P and mask S, and can be entered between board holding device 22 and mask holding device 10 by second imaging device moving device 130. As illustrated in FIG. 6, second imaging device moving device 130 includes x moving device 142 and y moving device 144. X moving device 142 includes electric motor 150, motion conversion mechanism 154 that converts the rotation of electric motor 150 into a linear motion of x slider 152, guide rail 156*a* and 156*b* extended in the x direction, and the like. Y direction moving device 144 is provided on x slider 152, and includes electric motor 158, y slider 161, motion conversion mechanism 160 that converts the rotation of electric motor 158 into a linear movement of slider 161, guide rail 162 extended in the y direction, and the like. Second imaging device 16 is integrally movably held by y slider 161, and is movable in the xy plane by x moving device 142 and y moving device 144.

Figure 7:
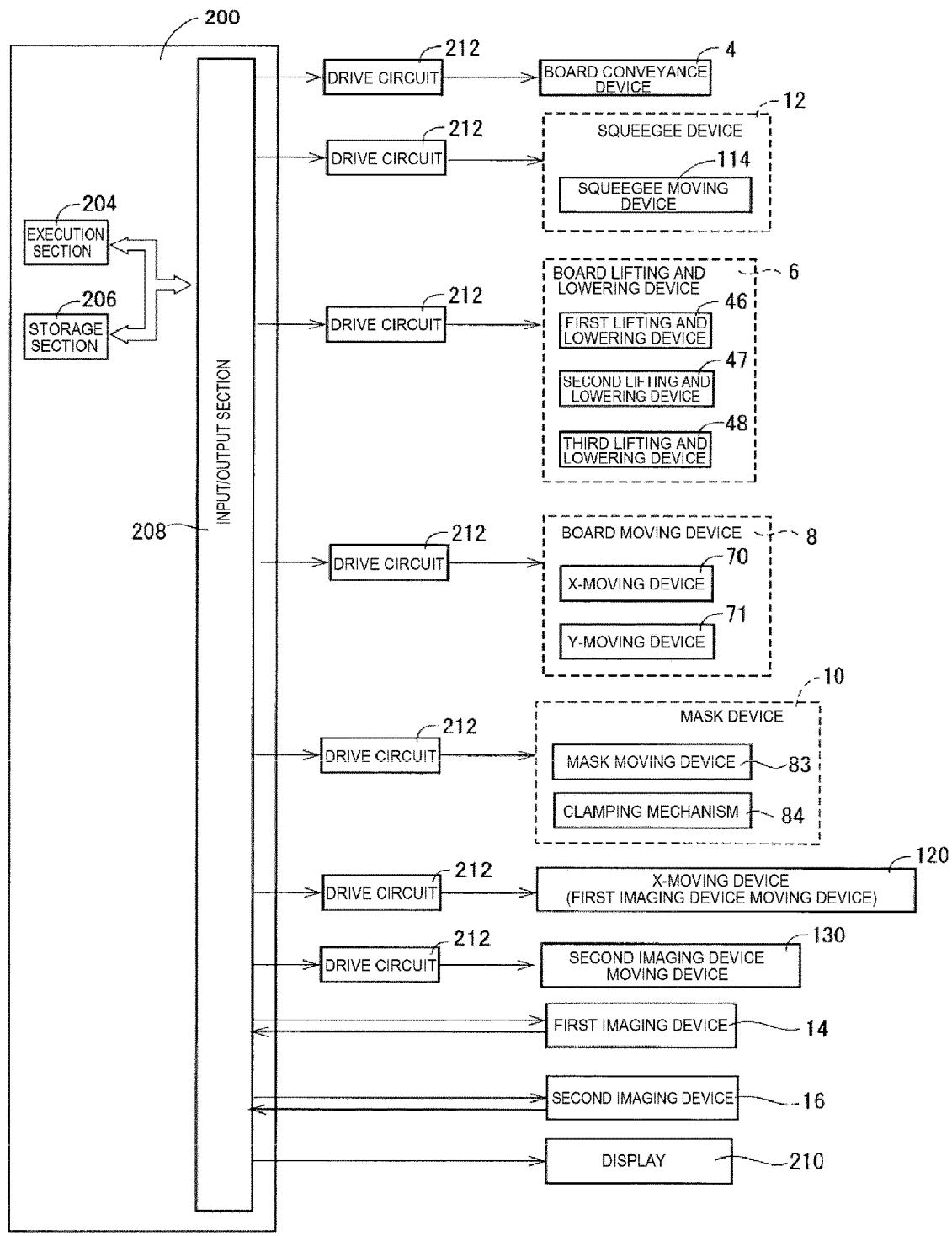
FIG. 7 is a block diagram conceptually illustrating the periphery of a control device of the mask printing machine.

The present mask printing machine is controlled by control device 200 illustrated in FIG. 7. The control device 200 mainly includes a computer, and includes execution section 204, storage section 206, input/output section 208, and the like. In input/output section 208, first imaging device 14, second imaging device 16, display 210 or the like is connected, and board conveyance device 4, board lifting and lowering device 6, board moving device 8, mask device 10, squeegee device 12, x moving device 120 of the first imaging device moving device, second imaging device moving device 130 or the like is connected via drive circuit 212. The state of the mask printing machine is displayed on display 210.

In the mask printing machine, usually, when board P is conveyed to a predetermined position below mask S by board conveyance device 4, reference marks Mp and Ms formed on board P and mask S, respectively, are imaged by second imaging device 16. A positional correction value, which is the movement amount of board P, is acquired such that the center points of pair of reference marks Mp and the center points of pair of reference marks Ms coincide with each other, and board P is moved by board moving device 8. The relative positions of board P and mask S are controlled and the position alignment is performed. The positional correction value of board P is referred to as a reference mark-based correction value. Thereafter, board P is lifted to a contact position where the upper surface contacts the lower surface of mask S, and squeegees 110*a* and 110*b* are moved, and thus the solder paste is applied to printing portion C of board P, and the mask printing is performed.

When mask S is pulled by mesh 86 and is in a state of being extended in a planar shape, as illustrated in FIG. 10, each of multiple through holes H is at a position indicated by a solid line when board P is at the separated position separated from mask S that is below mask S, and is at a position indicated by an alternate long and short dash line when board P is at the contact position. In this way, the movement amount of through hole H in the case where board P is lifted from the separated position to the contact position is very small, and the relative positions of through hole H and printing portion C are almost the same. Therefore, in the case where board P is in the separated position, the position alignment of board P and mask S are performed based on the reference mark-based correction value, and thereafter, board P is lifted to the contact position and the mask printing is performed, and the mask printing is performed accurately.

Figure 11:
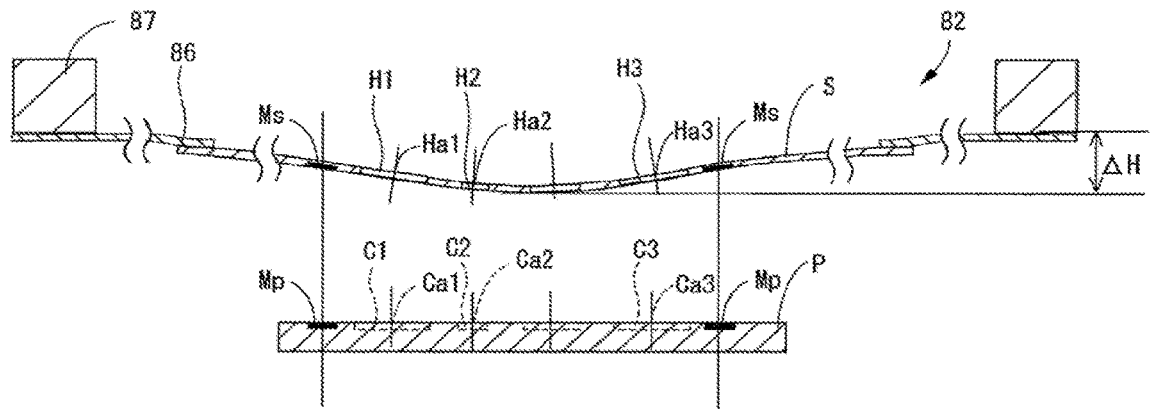
FIG. 11 is a diagram illustrating another state where the board is in the separated position in the mask printing machine.
Figure 12:
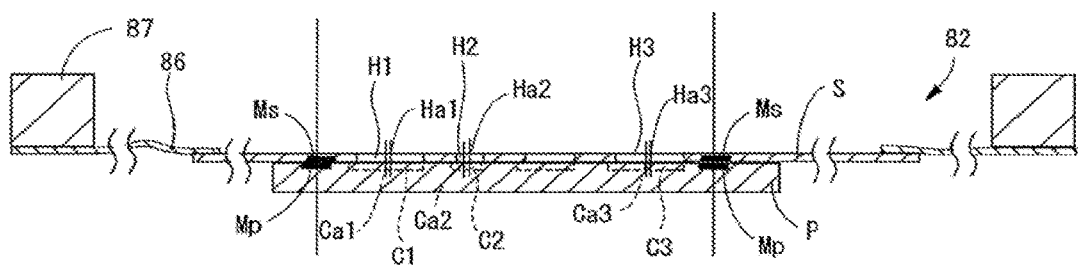
FIG. 12 is a diagram illustrating another state where the board is in the contact position in the mask printing machine.
Figure 13:
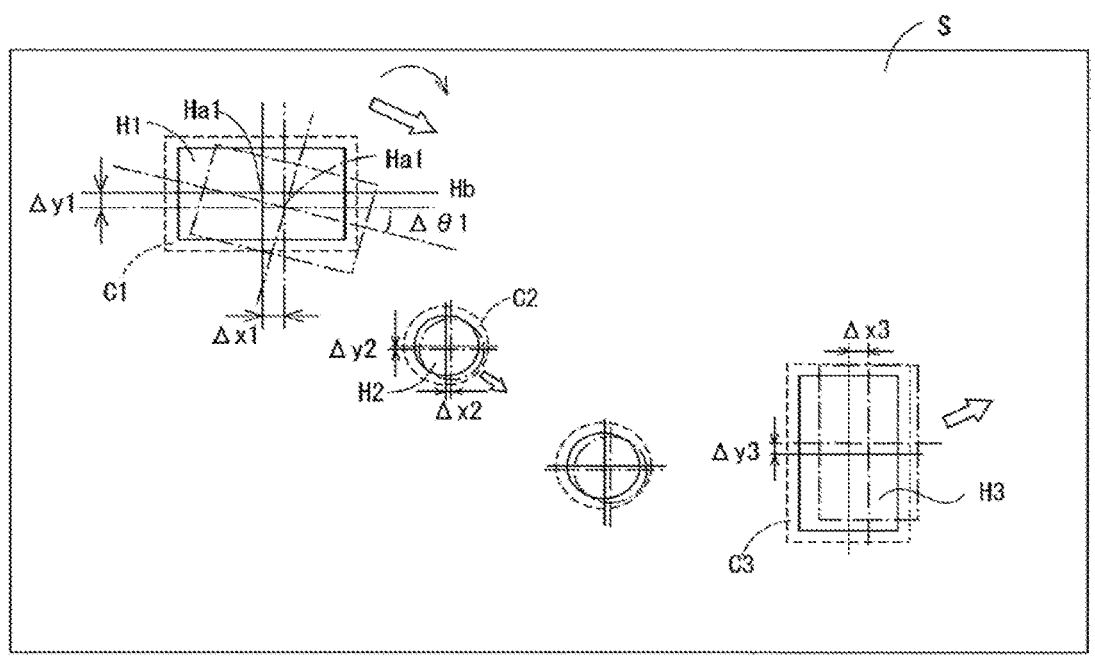
FIG. 13 is a diagram illustrating another movement state of the through hole formed in the mask.

However, when the pulling force of mesh 86 is reduced, mask S is loosened. Therefore, as illustrated in FIGS. 11 to 13, there is a case where mask S is deviated by board P lifted from the separated position to the contact position. Through hole H is moved, and the relative positions of through hole H and printing portion C are changed. For example, in a state where mask S is loosened, as illustrated in FIG. 13, because board P is lifted from the separated position to the contact position, through hole H is moved from the position indicated by the solid line to the position indicated by the alternate long and short dash line. Reference point Ha, which is the center point of through hole H1, is moved in the x direction by $\Delta x1$ and in the y direction by $\Delta y1$, and reference line Hb, which is a line extended in the longitudinal direction of through hole H1, is inclined by A81 around the z axis. Therefore, in the separated position of board P, after the position alignment between board P and mask S is performed in accordance with the reference mark-based correction value, when board P is lifted to the contact position and the mask printing is performed, the printing accuracy deteriorates. The deviation of mask S may occur due to mechanical errors or the like of board lifting and lowering device 6.

Therefore, in the present mask printing machine, in the first time when the mask printing is continuously performed using the same mask S, a movement state of target through hole H (multiple target through holes H in the present embodiment) that is at least one of multiple through holes H when board P is lifted from the separated position to the contact position is acquired, and based on the movement state, a movement state-based correction value is acquired as a positional correction value, which is the movement amount of board P. Target through hole H can be, for example, all of multiple through holes H, can be a predetermined part of multiple through holes, for example, at least one regularly selected through hole, can be, for example, a through hole (for example, it corresponds to a through hole corresponding to fine printing portion C) corresponding to at least one printing portion C that requires high-precision printing, or the like.

Specifically, when board P is at the separated position, first imaging device 14 images each of target through holes H while being moved in the y direction and the x direction along mask S by squeegee moving device 114 and x moving device 120. Next, when board P is in the contact position, each of target through holes H is imaged in the same manner. Further, the movement state of each of target through holes H is acquired based on these captured images. The movement amount Δx of each of reference points Ha of target through hole H in the x direction, the movement amount Δy in the y direction, the inclination angle Δθ of reference line Hb around the z axis, or the like corresponds to the physical quantity representing the movement state. Each of the Δx, Δy, and Δθ is a value having signs (+, −), and the direction of movement and the direction of inclination are known by the signs. As described above, the movement state of target through hole H can be represented by, for example, a moved data group (Δx, Δy, Δθ) which is a set of these physical quantities.

Further, the movement state-based correction value is acquired based on the acquired each of the moved data groups of target through hole H, and is stored in storage section 206. With respect to board P in which the mask printing is performed after the second time, in the separated position of board P, the relative positions of board P and mask S are controlled and the position alignment is performed based on the movement state-based correction value that is stored in storage section 206 and the reference mark-based correction value that is acquired for each board P. In the present embodiment, the movement state-based correction value, the reference mark-based correction value or the like are also represented by the same set of physical quantities as the physical quantities representing the movement state.

Figure 14:
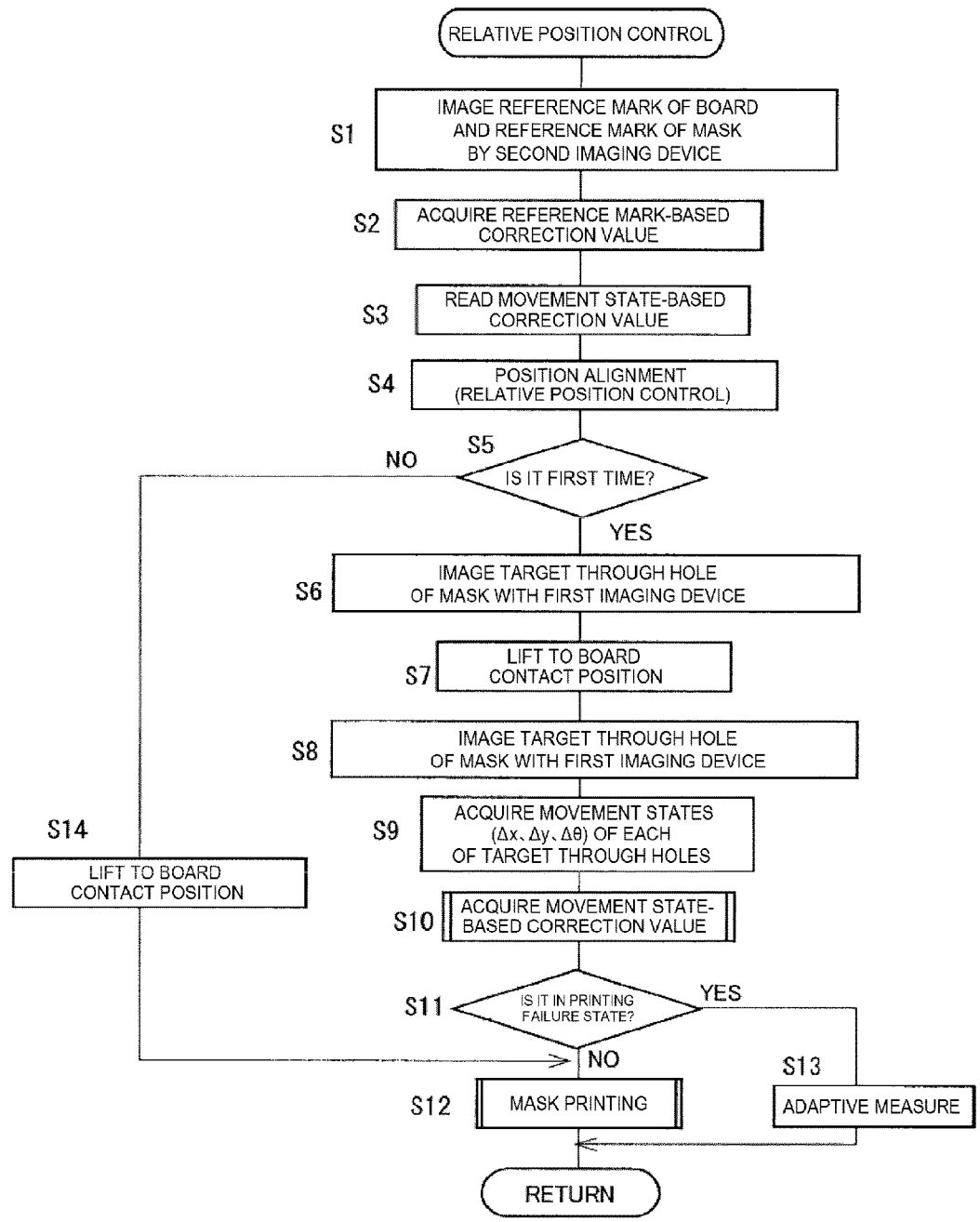
FIG. 14 is a flowchart representing a relative position control program stored in a storage section of the control device of the mask printing machine.

A mask printing program illustrated in the flowchart in FIG. 14 is executed each time board P reaches a predetermined position below mask S. When board P reaches the predetermined position, board P is in the separated position. In step 1 (hereinafter abbreviated as S1; the same applies to other steps), reference mark Mp of board P and reference mark Ms of mask S are imaged by second imaging device 16, and in S2, for example, reference mark-based correction values (hx2, hy2, hθ2) are acquired so that the center point of reference mark Mp and the center point of reference mark Ms coincide with each other. In S3, the movement state-based correction values (hx1, hy1, hθ1) stored in storage section 206 is read. The movement state-based correction value when the mask printing is performed for the first time can be, for example, zero, a previous value, or the like. In S4, board P is moved by board moving device 8 by the correction values (hx1+hx2, hy1+hy2, hθ1+hθ2) obtained by combining the movement state-based correction value and the reference mark-based correction value, the relative positions of board P and mask S are controlled, and the position alignment is performed.

Further, in S5, it is determined whether board P is the board for the first time. When board P is for the first time, in S6, each of target through holes H when board P is at the separated position is imaged by first imaging device 14, in S7, board P is lifted to the contact position, and in S8, each of target through holes H is imaged by first imaging device 14. Further, in S9, the moved data groups (Δx, Δy, Δθ) are acquired for each of target through holes H based on these captured images, and in S10, the movement state-based correction values (hx1, hy1, hθ1) are acquired based on the moved data group of each of multiple target through holes H, as described later.

Thereafter, in S11, it is determined whether it is in a printing failure state, which will be described later, and when the determination is NO, the mask printing is performed in S12. In contrast to this, when the determination is YES in S11, the mask printing is not performed, and in S13, the fact that it is in a printing failure state is displayed on display 210. When the determination is NO in S5, board P is lifted to the contact position in S14, and the mask printing is performed in S12.

Figure 15:
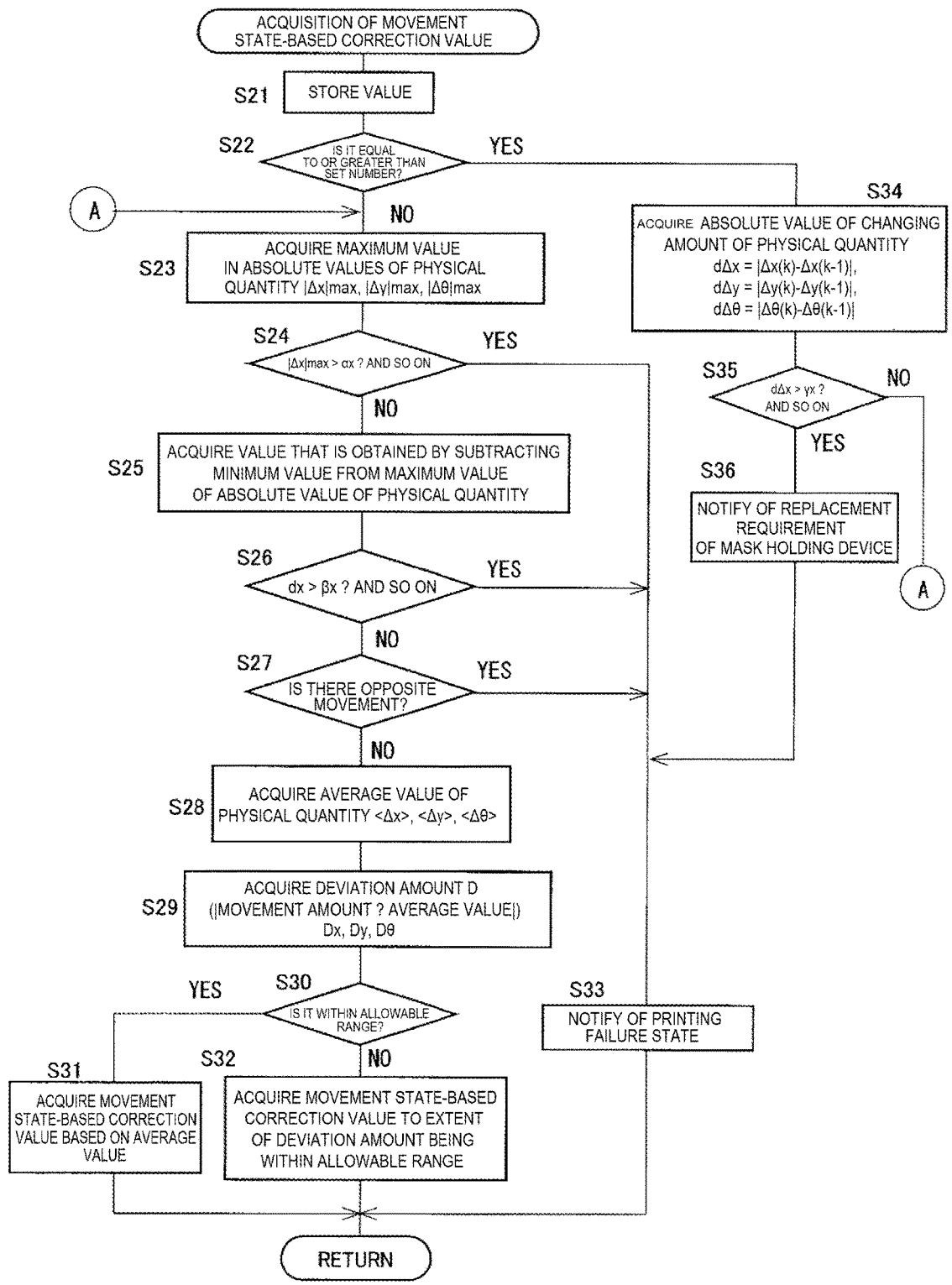
FIG. 15 is a flowchart representing a part of the relative position control program.

The movement state-based correction value in S10 is acquired, for example, in accordance with a routine represented by the flowchart in FIG. 15. In S21, the moved data group acquired in S9 is stored in storage section 206 for each target through hole H, and in S22, it is determined whether the number of the stored moved data groups is equal to or greater than a set number. The set number can be a number by which a change over time of target through hole H can be acquired, and in the present embodiment, it is set to two.

When the determination is NO in S22, the maximum values |Δx|max, |Δy|max, |Δθ|max, and |Δθ|max are acquired among the respective absolute values of the physical quantities representing the movement state of each of target through holes H in S23, and it is determined whether the maximum values |Δx|max, |Δy|max, and |Δθ|max are larger than the threshold values αx, αy, and α6, respectively, in S24. When the maximum values |Δx|max, |Δy|max, and |Δθ|max are all equal to or less than the threshold values αx, αy, and αθ, respectively, the determination is NO, and when at least one is larger than the corresponding threshold value, the determination is YES.

In S25, values dx(=|Δx|max−|Δx|min), dy(=|Δy|max−|Δy|min), and dθ(=|Δθ|max−|Δθ|min) that are obtained by subtracting the minimum value from the maximum value among each of the absolute values of the physical quantities representing the movement state of each of target through holes H are acquired, and it is determined whether the values dx, dy, and dθ are larger than the threshold values βx, βy, and βθ, respectively, in S26. When all the values dx, dy, and dθ obtained by subtracting the minimum value from the maximum value are equal to or less than the threshold values βx, βy, and βθ, respectively, the determination is NO, and when at least one of the dx, dy, and dθ is larger than the corresponding threshold value, the determination is YES.

In S27, it is determined whether there are two target through holes H in which directions of movement or inclination are opposite to each other based on the direction of the movement of reference point Ha of each of target through holes H and the direction of the inclination of reference line Hb. For example, it is determined whether target through hole H in which the sign of Δx is positive (+) and target through hole H in which the sign of Δx is negative (−) are present.

When the determinations are all NO in S24, S26, and S27, the average values <Δx>, <Δy>, and <Δθ> of the physical quantities representing the movement states of target through holes H are acquired in S28, and the deviation amounts Dx, Dy, and Dθ of target through holes H are acquired in S29. The deviation amount is an absolute value of a value obtained by subtracting the average value corresponding to the physical quantity representing the movement state in each of target through holes H. Dx=|Δx−<Δx>|, Dy=|Δy−<Δy>|, Dθ=|Δθ−<Δθ>| As for these deviation amounts, for each of target through holes H, the allowable range is individually determined in advance. For example, target through hole H, which corresponds to printing portion C where the high-precision printing is required, is set to have a smaller allowable range than target through hole H, which corresponds to printing portion C where the high-precision printing is not required.

Further, in S30, it is determined whether each of the deviation amounts (Dx, Dy, Dθ) of the physical quantities representing the movement state of each of target through holes H is within the allowable range. When each of all the deviation amounts Dx, Dy, and Dθ of target through holes H is within the allowable range, the determination is YES in S30, and in S31, the movement state-based correction value is acquired based on the average value acquired in S28 and is stored in storage section 206. For example, the average value can be set as a movement state-based correction value. (hx1, hy1, hθ1)=(<Δx>, <Δy>, <Δθ>) In contrast, when the determination is NO in step S30, in S32, the movement state-based correction value is acquired based on the deviation amount of each of target through holes H and the allowable range and is stored in storage section 206. Since the determinations are all NO in S25 to S27, it is considered that the value in the vicinity of the average value can be acquired as the movement state-based correction value.

In contrast, when the determination is YES in at least one of S25 to S27, it is determined that it is in the printing failure state in S33. This is because it may be considered to be difficult to determine the movement state-based correction value and difficult to perform the mask printing with high accuracy even based on the movement state-based correction value when the maximum value of the absolute value of the physical quantity that represents the movement state is larger than the threshold value, when there is a large variation in the physical quantity that represents the movement state, and when there are two target through holes H that can be moved in opposite directions.

On the other hand, when the determination is YES in S22, in S34, for each of target through holes H, based on multiple moved data groups, the absolute values (dΔx, dΔy, dΔθ) of the respective changing amounts of the physical quantity representing the movement state, that is, the absolute values ($|\Delta x_{(k)}-\Delta x_{(k-1)}|, |\Delta y_{(k)}-\Delta y_{(k-1)}|, |\Delta\theta_{(k)}-\Delta\theta_{(k-1)}|$) obtained by subtracting the previous value from the current value of the physical quantity, are acquired, and in S35, it is determined whether the absolute values (dΔx, dΔy, dΔθ) of the changing amounts in these physical quantities are larger than the threshold values γx, γy, γθ, respectively. When at least one of the absolute values of the changing amounts of the physical quantities is larger than the corresponding threshold value, the determination is YES, and in S36, it is determined that the pulling force of mesh 86 is reduced and that it is a desirable state to replace mesh 86, mask S, and the like. The fact that mask holding device 82 is abnormal is displayed on display 210, and S33 is executed. In contrast, when the determination is NO in S35, the movement state-based correction value is acquired in the same manner after S23.

As described above, in the present embodiment, it is possible to acquire the movement state of through hole H formed in mask S when board P is lifted from the separated position to the contact position. It becomes possible to acquire the movement state-based correction value which is the positional correction value of board P based on the movement state, and at the separated position of board P, the relative positions of board P and mask S can be controlled based on both the reference mark-based correction value and the movement state-based correction value. As a result, even in a state in which the pulling force of mesh 86 is reduced, in the contact position of board P, it is possible to accurately match through hole H and printing portion C, and it is possible to suppress a decrease in printing accuracy of board P. Further, it can be satisfactorily acquired whether mask holding device 82 is in a state that needs to be replaced due to reducing the pulling force of mesh 86. Furthermore, in the separated position of board P, since it is known whether it is in a printing failure state, it is possible to avoid the production of a board having a printing failure in advance.

Figure 16:
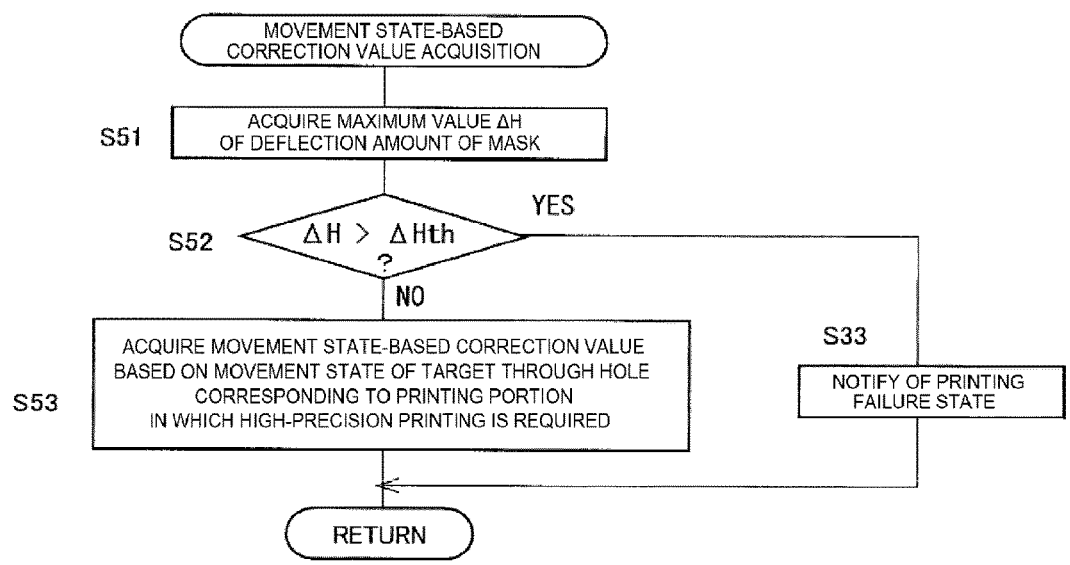
FIG. 16 is a flowchart representing another aspect of a part of the relative position control program.

The movement state-based correction value can be acquired according to the routine represented by the flowchart in FIG. 16. In the present embodiment, all of through holes H are set as the target through holes. In S51, the maximum value ΔH (see FIG. 11) of a bending amount as a bending state of mask S based on the movement state of each of the target through holes H is acquired. For example, it can be estimated that the bending amount is larger in a portion where the movement amount of each of the reference points of target through hole H is larger than in a portion where the movement amount is smaller. In S 52, it is determined whether the maximum value ΔH of the bending amount is larger than the threshold value ΔHth. When the determination is NO, in S53, the movement state-based correction value is acquired based on the movement state of target through hole H corresponding to printing portion C in which the high-precision printing is required. For example, the movement state-based correction value can be acquired such that the deviation amount of target through hole H corresponding to printing portion C in which the high-precision printing is required, is within the allowable range. In contrast to this, when the determination is YES in S52, it is determined that it is in the printing failure state in S33.

As described above, in the present embodiment, a movement state acquiring device is configured by portions for storing and executing S6 to S10 of control device 200. Among the portions, a first printing failure state acquiring section and a second printing failure state acquiring section are configured by portions for storing and executing S33, or the like, an average value acquiring section is configured by portions for storing and executing S28, or the like, a bending state acquiring section is configured by portions for storing and executing S51, or the like, and a replacement required state acquiring section is configured by portions for storing and executing S34 to S36, or the like. Further, board moving device 8 corresponds to a relative moving device, and a relative movement control section is configured by portions for storing and executing S4, or the like.

The relative moving device can be set as mask moving device 83, or can be set as board moving device 8 and mask moving device 83, or the like. It is not essential to acquire the movement amount of reference point Ha of through hole H, the movement direction, the inclination angle of reference line Hb, and the inclination direction as the movement state, and only one or more of these need be acquired. Furthermore, the movement state-based correction value can be acquired for each mask printing of board P and then can be reflected in the position alignment of board P on which the mask printing is performed. In that case, S5 and S14 are not required, and S6 can be executed in parallel with S1 to S4. Further, in S34, the present disclosure can be implemented in a form in which various changes and improvements are made based on knowledge of those skilled in the art, such that it is possible to acquire an average value of an absolute value of a changing amount of a movement amount multiple times.

REFERENCE SIGNS LIST

6: board lifting and lowering device, 8: board moving device, 10: mask device, 12: squeegee device, 14: first imaging device, 16: second imaging device, 110*a*, 110*b*: squeegee, 57: first lifting and lowering table, 83: mask moving device, 82: mask holding device, 86: mesh, 87: mask frame, 114: squeegee moving device, 120: x moving device, 130: second imaging device moving device

The invention claimed is:

1. A mask printing machine for printing viscous fluid on a circuit board through multiple through holes formed on a mask, comprising:
   a mask holding device configured to hold the mask;
   a board lifting and lowering device configured to lift and lower the circuit board between a separated position, which is below the mask held by the mask holding device and separated from the mask, and a contact position at which the circuit board contacts a lower surface of the mask;
   a first imaging device capable of entering above the mask held by the mask holding device and capable of imaging each of the multiple through holes; and
   a control device configured to
      capture a first image of each of at least one target through hole based on each of target through holes that are the at least one through hole among the multiple through holes of the mask when the circuit board is at the separated position by the first imaging device,
      lift the circuit board to the contact position,
      capture a second image of each of the at least one target through hole by the first imaging device,
      acquire moved data groups for each of the at least one target through hole based on the first image and the second image,
      acquire movement state-based correction values based on the moved data groups for each of the at least one target through hole, and
      determine whether the mask printing machine is in a printing failure state based on the movement state-based correction values.

2. The mask printing machine according to claim 1, wherein the control device is configured to acquire a movement amount of a reference point of each of multiple target through holes as the at least one target through hole, as a physical quantity representing the movement state, and acquire an average value of the movement amount of the reference point of each of the multiple target through holes.

3. The mask printing machine according to claim 1, wherein the control device is configured to acquire a movement amount of a reference point of each of the multiple target through holes as the at least one target through hole, as a physical quantity representing the movement state, and set the printing failure state in at least one of a case where a maximum value of the movement amount of the reference point of each of the multiple target through holes is larger than a set movement amount and a case where a difference between the maximum value and a minimum value of the movement amount of the reference point of each of the multiple target through holes is larger than a set difference.

4. The mask printing machine according to claim 1, wherein the control device is configured to acquire a movement direction of a reference point of each of the multiple target through holes as the at least one target through hole, as a state representing the movement state, and set the printing failure state in a case where movement directions of the reference points of two target through holes among the multiple target through holes are opposite to each other.

5. The mask printing machine according to claim 1, wherein the control device is configured to acquire a change over time of the movement state of each of the at least one target through hole, and acquire whether the mask holding device is in a replacement required state based on the acquired change over time.

6. The mask printing machine according to claim 1, wherein the control device is configured to acquire a bending state of the mask based on the movement state of each of the multiple target through holes as the at least one target through hole.

7. The mask printing machine according to claim 1, further comprising:
   a relative moving device configured to relatively move the circuit board and the mask in a horizontal direction,
   wherein the control device is configured to control relative positions of the circuit board and the mask by controlling the relative moving device based on the movement state of each of the at least one target through hole detected by the control device.

8. The mask printing machine according to claim 7, wherein the control device is configured to control a relative positional relationship between the circuit board and the mask based on an allowable range of a deviation amount of each of reference points of the multiple target through holes defined for each of the multiple target through holes as the at least one target through hole.

9. The mask printing machine according to claim 7, further comprising:
   a second imaging device capable of entering between the circuit board and the mask when the circuit board is at the separated position,
   wherein the control device is configured to control the relative moving device based on relative positions of at least one reference mark formed on the mask and at least one reference mark formed on the circuit board, which are imaged by the second imaging device when the circuit board is at the separated position, and the movement state of each of the at least one target through hole.

* * * * *